(12) United States Patent
Lee

(10) Patent No.: US 7,279,394 B2
(45) Date of Patent: Oct. 9, 2007

(54) METHOD FOR FORMING WALL OXIDE LAYER AND ISOLATION LAYER IN FLASH MEMORY DEVICE

(75) Inventor: Seung Cheol Lee, Ichon-Shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 308 days.

(21) Appl. No.: 11/016,436

(22) Filed: Dec. 17, 2004

(65) Prior Publication Data

US 2006/0073661 A1 Apr. 6, 2006

(30) Foreign Application Priority Data

Oct. 6, 2004 (KR) .................... 10-2004-0079505

(51) Int. Cl.
*H01L 21/76* (2006.01)
(52) U.S. Cl. .............. 438/424; 438/431; 438/435; 438/257
(58) Field of Classification Search ............... 438/424, 438/431, 435, 257
See application file for complete search history.

(56) References Cited

U.S. PATENT DOCUMENTS

| | | | | |
|---|---|---|---|---|
| 6,541,382 | B1 * | 4/2003 | Cheng et al. ............. | 438/692 |
| 2003/0040189 | A1 * | 2/2003 | Chang et al. ............. | 438/700 |
| 2003/0194870 | A1 | 10/2003 | Hsu ......................... | 438/694 |
| 2007/0004118 | A1 * | 1/2007 | Varghese et al. .......... | 438/199 |

FOREIGN PATENT DOCUMENTS

| | | |
|---|---|---|
| CN | 1521838 A | 8/2004 |
| JP | 2004-179301 A | 6/2004 |
| KR | 2002-83145 | 10/2004 |
| TW | 434793 | 5/2001 |

OTHER PUBLICATIONS

Office action issued in corresponding Taiwanese application No. 93138677 filed Oct. 6, 2004.
Official action dated May 11, 2007 for counterpart Chinese Application No. 200510072686.6 (Chinese original and English translation included).

* cited by examiner

*Primary Examiner*—Jack Chen
(74) *Attorney, Agent, or Firm*—Marshall Gerstein & Borun LLP

(57) ABSTRACT

Disclosed herein are methods for forming wall oxide films in flash memory devices and methods for forming isolation films. After trenches are formed in the substrate, an ISSG (In-Situ Steam Generation) oxidization process is performed to form wall oxide films on sidewalls of the trenches. This process prohibits formation of facets at the top and bottom edge portions of the trenches. Thus, the top edges of the trenches are rounded. Furthermore, the ISSG oxidization process is performed at a low temperature for a relatively short time. Therefore, thermal stress due to carrying out an oxidization process for a long time is reduced and a dislocation phenomenon is thus prevented from occurring.

7 Claims, 6 Drawing Sheets

METHOD FOR FORMING WALL OXIDE LAYER AND ISOLATION LAYER IN FLASH MEMORY DEVICE

BACKGROUND

1. Technical Field

Methods for forming wall oxide films and isolation films for flash memory devices are disclosed. More specifically, a disclosed method for forming wall oxide films prevents a "dislocation" phenomenon where a sidewall within the trench is broken due to thermal stress caused by an oxidization process performed after the trench is formed. A method of forming an isolation film in the flash memory device using the same is also disclosed.

2. Description of the Related Art

Recently, there is an increased demand for flash memory devices which can be electrically programmed and erased and which do not need a refresh function that data is rewritten in a given period. "Program" refers to an operation for writing data into memory cells, and erase refers to an operation for erasing data written into memory cells. Furthermore, research into higher-integration technology of memory devices has been actively conducted in order to develop memory devices with large capacities.

In a flash memory device, an isolation film is formed by means of a shallow trench isolation (STI) process in order to electrically isolate neighboring elements (for example, cells and transistors). Typically, a STI process is performed by forming a pad oxide film and a pad nitride film on a substrate, performing a trench etch process to form trenches in the substrate, and then depositing an insulating film so that the trenches are buried or filled, thus forming an isolation film.

The STI process includes a wall oxidization process, which is performed on the sidewall within the trenches in order to compensate for damage to the sidewalls of the trenches, which are damaged by the trench etch process or to control the area of the active region, after the trench etch process is performed. Wall oxide films are formed on the sidewalls of the trenches by this wall oxidization process.

Generally, the wall oxidization process is carried out in a furnace, a high thermal stress is caused, and a dislocation phenomenon in which the silicon sidewall portion is broken at the top/bottom regions of the trenches is generated. This dislocation phenomenon generates a path along which the leakage current flows, and thus causes device characteristics to degrade. Furthermore, in an ion implant process for forming subsequent source and drain regions, the dislocation phenomenon causes defects to occur in an active region as well as the source and drain regions.

SUMMARY OF THE DISCLOSURE

Accordingly, in view of the above problems, a method for forming wall oxide films for a flash memory device is disclosed in which a dislocation phenomenon is avoided where sidewalls within trenches are broken due to an oxidization process performed after formation of the trenches. The resulting device characteristics are therefore improved. A method of forming an isolation film in the flash memory device using the same is also disclosed.

One disclosed method for forming wall oxide films in a flash memory device comprises providing a semiconductor substrate in which trenches are formed, and performing an oxidization process in a gas atmosphere of $H_2$ and $O_2$ in an ISSG oxidization mode, thus forming wall oxide films on sidewalls of the trenches.

Another disclosed method for forming an isolation film in a flash memory device, comprises providing a semiconductor substrate in which a pad oxide film is formed, depositing a pad nitride film on the pad oxide film, etching the pad nitride film and the pad oxide film, and at the same time, recessing some of the top of the semiconductor substrate to form first trenches, forming spacers on the sidewalls of the first trenches, performing a first oxidization process in a ISSG oxidization mode in a gas atmosphere of $H_2$ and $O_2$, thus oxidizing the top of the semiconductor substrate which is exposed through the spacers, etching the semiconductor substrate deeper than the first trenches to form second trenches, performing a second oxidization process in a ISSG oxidization mode in a gas atmosphere of $H_2$ and $O_2$, thereby forming wall oxide films on the sidewalls of the second trenches, and forming an isolation film to bury or fill the second trenches.

DETAILED DESCRIPTION OF THE PRESENTLY PREFERRED EMBODIMENTS

FIGS. 1 to 10 are cross-sectional views for explaining a disclosed method for forming a wall oxide films of a flash memory device and a method for forming an isolation film according to a preferred embodiment. A NAND flash memory device will be described as an example. Meanwhile, in FIGS. 1 to 10, "cell" indicates a cell region in which a memory cell is formed, "HV" indicates a high voltage region in which a high voltage transistor for driving the memory cell is formed, and "LV" indicates a low voltage region in which a low voltage transistor is formed.

Figure 1:
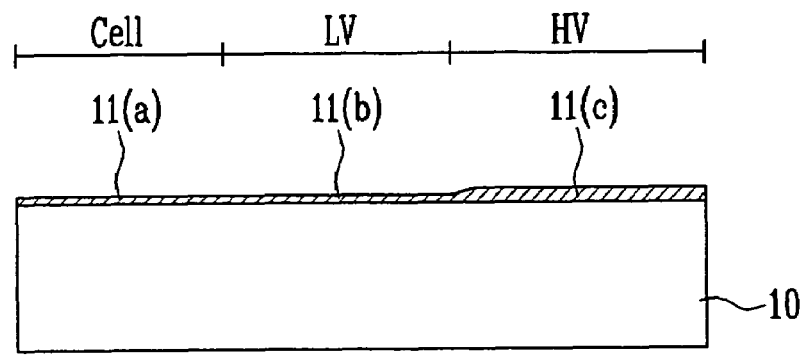
FIGS. 1 to 10 are cross-sectional views for explaining a disclosed method for forming wall oxide films of a flash memory device and a method for forming an isolation film.

Referring to FIG. 1, a semiconductor substrate 10 on which a pre-treatment cleaning process are been performed is provided. The pre-treatment cleaning process can include cleaning the semiconductor substrate 10 using diluted HF (DHF) (for example, HF solution in which $H_2O$ is diluted in the ratio of 50:1) and then cleaning it using a solution in which SC-1 $NH_4OH/H_2O_2/H_2O$ solution is mixed in a given ratio, or cleaning the semiconductor substrate 10 using BOE (Buffer Oxide Etchant) (for example, a mixing solution of HF and $NH_4F$ in which $H_2O$ is diluted in the ratio of 100:1 or 300:1 [the ratio of HF to $NH_4F$ is 1:4 to 1:7]) and then cleaning it using SC-1.

Thereafter, a screen oxide film (not shown) is formed on the semiconductor substrate 10. The screen oxide film serves to prevent the surface of the semiconductor substrate 10 from being damaged in well during the threshold voltage ion implant processes, which are performed subsequently.

An ion implant process is then performed within the semiconductor substrate 10, thus forming a well (not shown). If the semiconductor substrate 10 is a P-type substrate, the well can be composed of a Triple N (TN)-well) and a P-well. The TN-well is formed by the ion implant process using phosphorus (P) and the P-well is formed by the ion implant process using boron (B).

In order to form a channel, a threshold voltage ion implant process is performed on the semiconductor substrate 10. Then, an oxide film 11 is then formed on the semiconductor substrate 10. In this time, the oxide film 11 is formed with a greater thickness in the high voltage region HV than in the cell region Cell and the low voltage region LV.

For example, a wet oxidization process is first performed to form a thin oxide film on the entire surface including the cell region Cell, the low voltage region LV and the high voltage region HV. A wet oxidization process is then performed again using a mask through which the high voltage region HV is opened, thus thickly forming the oxide film 11 in the high voltage region HV. This oxide film 11 can be formed by performing a wet oxidization process at a temperature ranging from 750° C. to 800° C. and then performing an annealing process using $N_2$ at a temperature ranging from 900° C. to 910° C.

Meanwhile, although not described in the above description, a cleaning process can be performed at least once using DHF and SC-1 while the above process steps are performed.

For convenience, hereinafter, the oxide film 11 formed in the cell region Cell is called a 'pad oxide film 11a', the oxide film 11 formed in the low voltage region LV is called a 'low voltage gate oxide film 11b', and the oxide film 11 formed in the high voltage region HV is called a 'high voltage gate oxide film 11c'.

Figure 2:
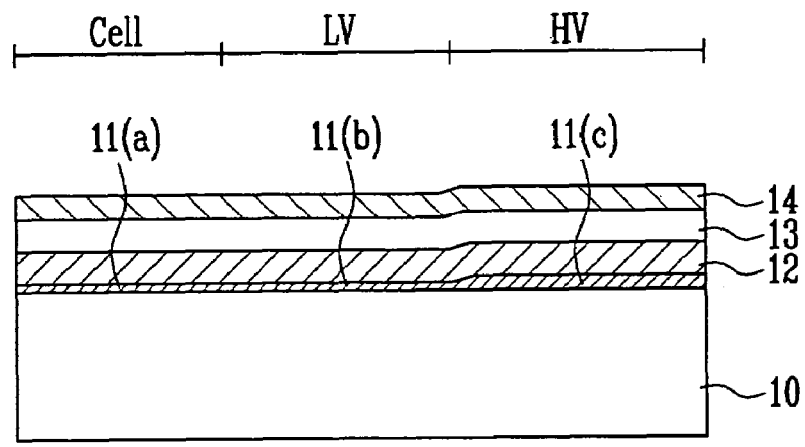

Referring to FIG. 2, a pad nitride film 12 is deposited on the entire surface including the pad oxide film 11a, the low voltage gate oxide film 11b and the high voltage gate oxide film 11c. The pad nitride film 12 can be deposited by low-pressure CVD (LPCVD). In this time, the pad nitride film 12 is deposited with a thickness in the range of 500 Å to 600 Å preferably about 550 Å.

A hard mask is then deposited on the pad nitride film 12 in order to perform a subsequent trench etch process. In this time, the hard mask is formed to have the stack structure of a DCS-HTO (DiChloroSilane ($SiH_2Cl_2$)-high temperature oxide) film 13 and a SiON film 14. The DCS-HTO film 13 serves to prevent the pad nitride film 12 from being damaged, and is deposited 250 to 350 Å, preferably about 300 Å. Furthermore, the SiON film 14 is deposited with a thickness in the range of 550 to 650 Å, preferably about 600 Å.

Figure 3:
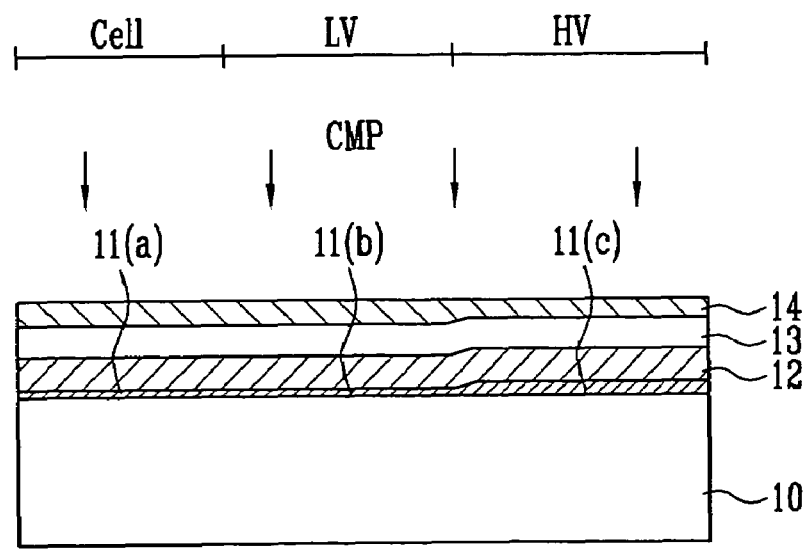

Referring to FIG. 3, a polishing process is performed in a CMP mode in order to polish the entire surface including the hard mask while reducing the step between the cell region Cell and the high voltage region HV. At this time, the polishing process can be performed in a blanket or etch-back mode, if needed.

Figure 4:
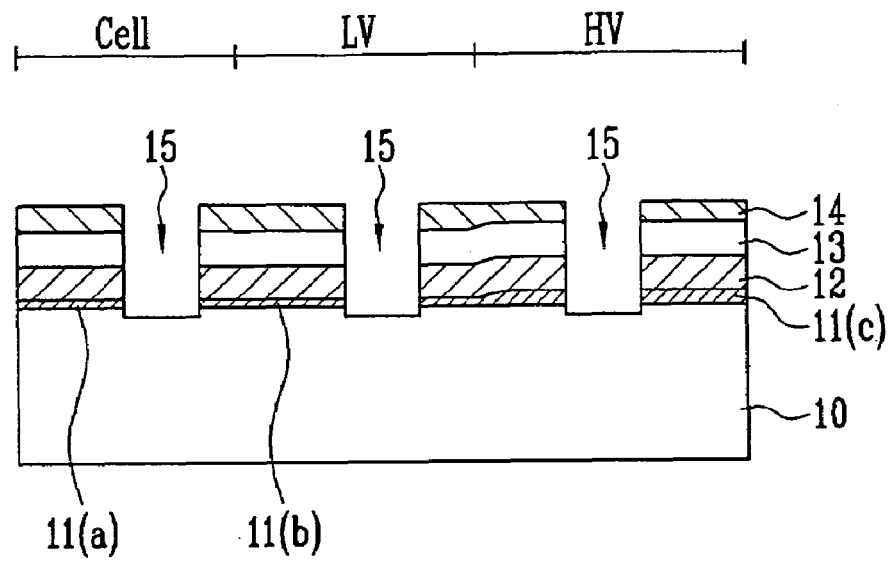

Referring to FIG. 4, a photoresist is coated on the entire surface including the hard mask. An exposure process and a development process using a photo mask are then sequentially performed to form a photoresist pattern (not shown).

Thereafter, an etch process using the photoresist pattern as an etch mask is performed to pattern the hard mask. The photoresist pattern is then stripped though a strip process.

An etch process using the patterned hard mask as an etch mask is then performed to etch the pad nitride film 12 and the oxide film 11. At this time, the etch process is preferably performed so that some of the top of the semiconductor substrate 10 is recessed. First trenches 15, which are formed by the recessed some of the semiconductor substrate 10, are formed by the etch process.

Figure 5:
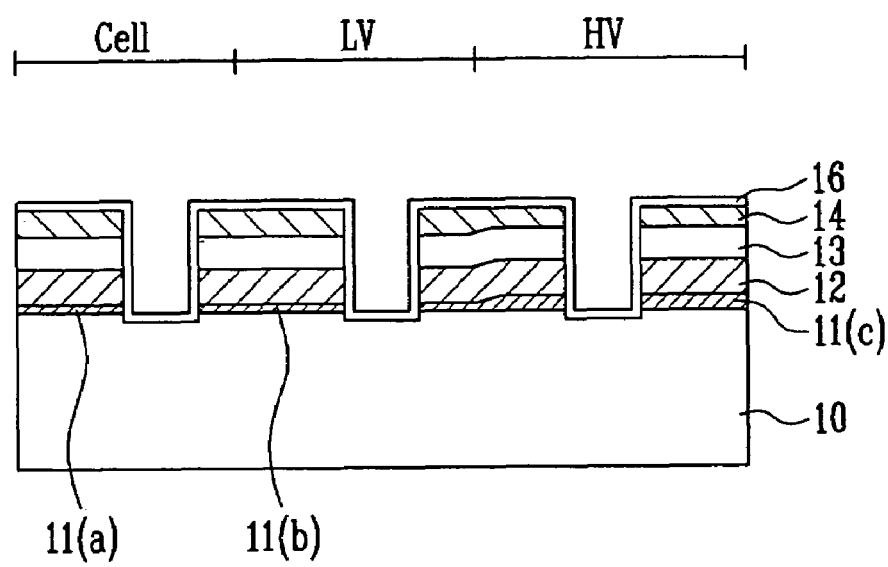

Referring to FIG. 5, an insulating film 16 for spacers is deposited along the step on the entire surface in which the first trenches 15 are formed. At this time, the insulating film 16 for spacers can be formed using a middle temperature oxide (MTO) film. Also, the insulating film 16 for the spacers can be formed by using any one of TEOS (Tetra Ethyle Ortho Silicate), BPSG (Boron Phosphorus Silicate Glass), SOG (Spin On Glass) and USG (Un-doped Silicate Glass).

Figure 6:
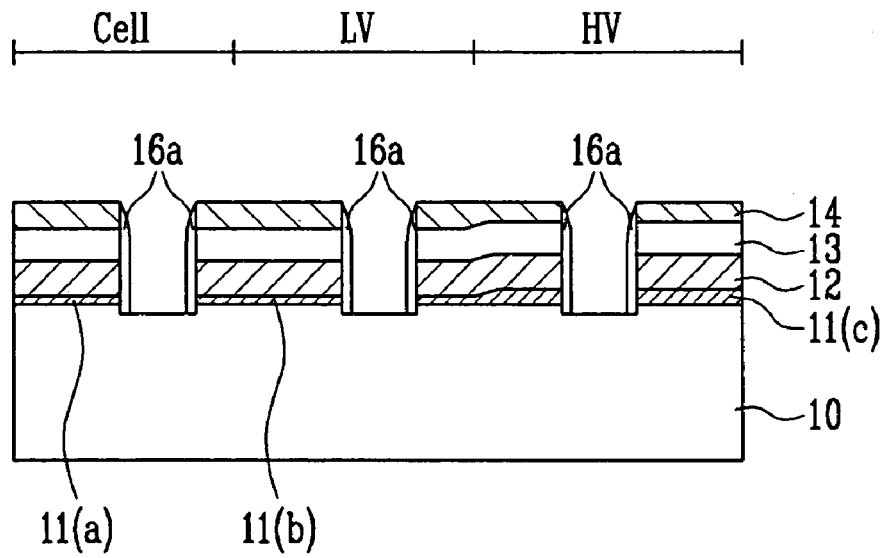

Referring to FIG. 6, a blanket etch process is performed anisotropically to form spacers 16a on the sidewalls of the first trenches 15. At this time, the blanket etch process can be performed in a blanket mode. The spacers 16a are formed on the sidewalls of the hard mask, the pad nitride film 12, the oxide film 11 and some of the top of the semiconductor substrate 10 through this blanket etch process.

Figure 7:
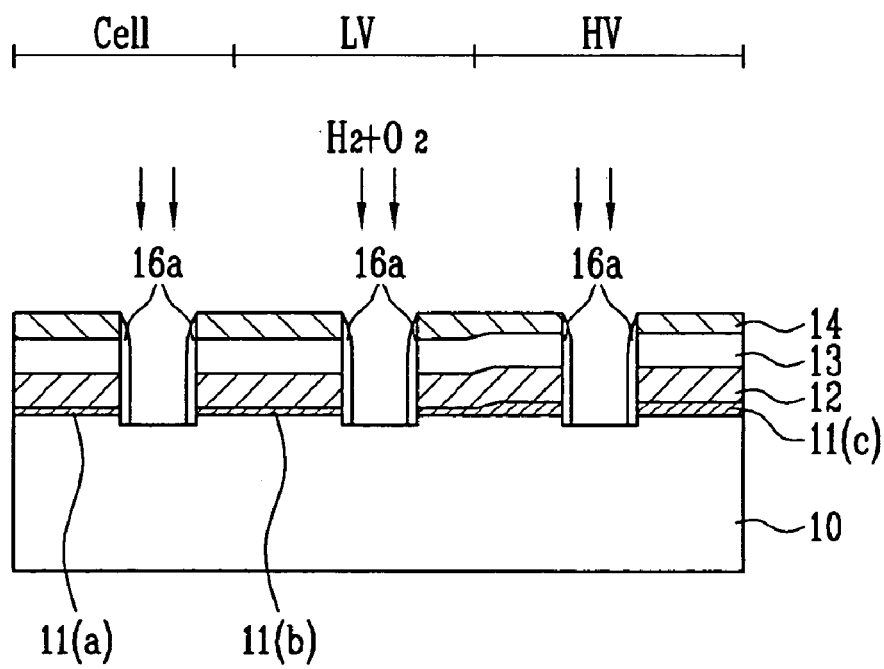

Referring to FIG. 7, an in-situ steam generation (ISSG) oxidization process is performed on the semiconductor substrate 10 that is exposed between the spacers 16a. The ISSG oxidization process is performed with a gas atmosphere of $H_2$ and $O_2$. The reason why the ISSG oxidization process is performed is for making rounded a top edge portion of each of second trenches (see "17" in FIG. 8), which are formed in a subsequent trench etch process.

Figure 8:
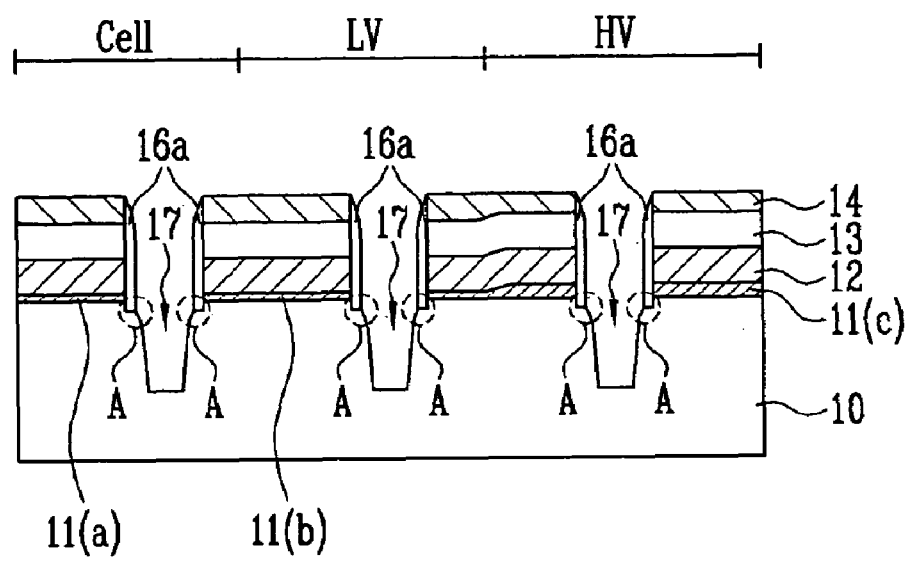

Referring to FIG. 8, a trench etch process is performed to etch the semiconductor substrate 10 that is exposed, thus forming the second trenches 17 that are deeper than the first trenches 15. A plurality of the second trenches 17 are formed in the cell region Cell, the low voltage region LV and the high voltage region HV, respectively. At this time, the second trenches 17 is preferably formed in a depth which can provide an isolation property so that the memory cells and/or the transistors can be electrically isolated.

Meanwhile, after the trench etch process, the top edge portions "A" of the second trenches 17, which are coupled to the bottoms of the spacers 16a, have a rounded shape by means of the ISSG oxidization process performed in FIG. 7.

Figure 9:
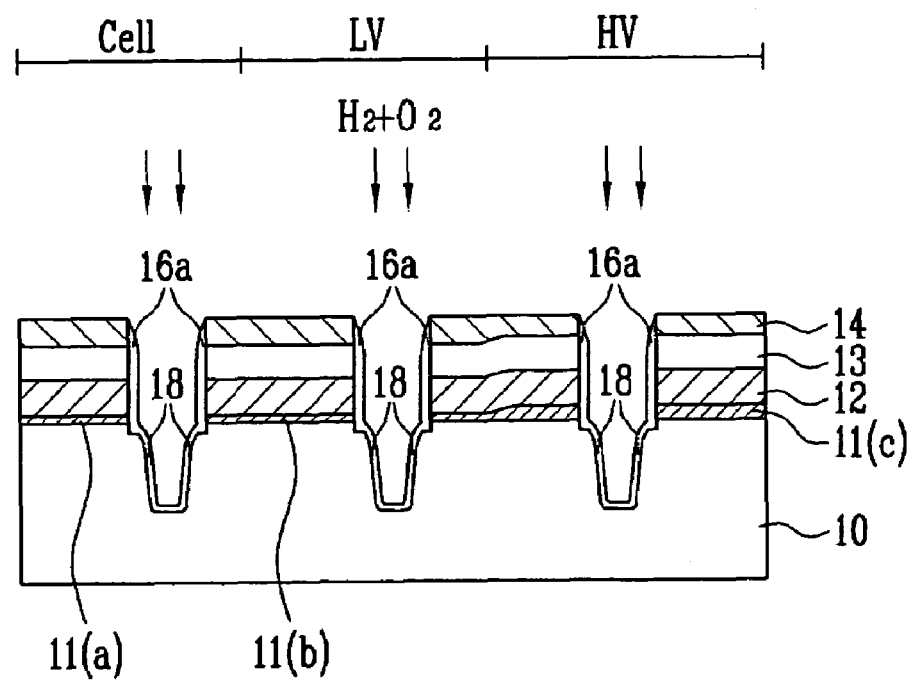

Referring to FIG. 9, an ISSG oxidization process is performed on the first trenches 15 and the second trenches 17 to form the wall oxide films 18 on the sidewalls of the second trenches 17. At this time, the wall oxide films 18 are formed with a thickness of about 15 to 30 Å. Furthermore, the ISSG oxidization process is performed at a temperature ranging 850° C. to 1000° C. and a pressure ranging from 1 to 10 torr in the gas atmosphere of $H_2$ and $O_2$. Furthermore, in the ISSG oxidization process, the gas atmosphere that includes $H_2$ and $O_2$ is set to be an $O_2$-rich gas atmosphere. That is, the amount of $O_2$ is higher than that of $H_2$. Preferably, in the entire mixing ratio, the mixing ratio of $O_2$ can be set to 33% to 60%, and the mixing ratio of $H_2$ can be se to 0.5% to 33%. Higher amounts of $O_2$ are used because $O_2$ has a great influence upon the oxidation rate. If the ISSG oxidization process is performed at in the gas atmosphere of $H_2$ and $O_2$, it can be expressed into the following chemical equation A.

$$H_2 + O_2 \rightarrow H_2O + O + OH \quad (A)$$

In equation (A), the O and OH radicals generated by reaction of $H_2$ and $O_2$ controls the oxidation rate.

The ISSG oxidization process performed to form the wall oxide films 18 can reduce a crystal orientation effect compared to a typical furnace process.

Meanwhile, a profile of the wall oxide films 18 at the top edge portions of the second trenches 17 will be described in the case where the wall oxide films 18 are formed by a thermal process (using a furnace apparatus) and the case where the wall oxide films 18 are formed by the ISSG oxidization method as in a preferred embodiment.

Figure 11:
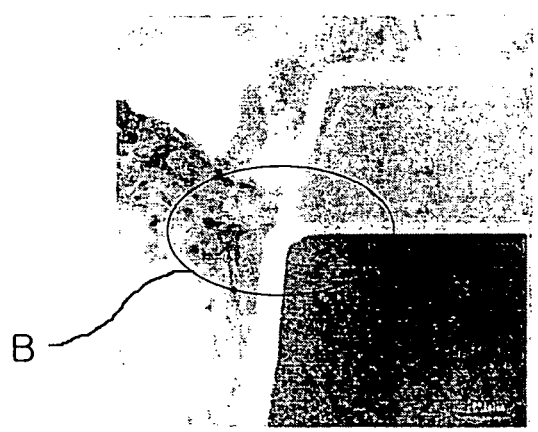
FIG. 11 is a TEM (Transmission Electron Microscope) showing the wall oxide films formed by the method illustrated in FIGS. 1–10.

FIG. 11 shows a wall oxide film B formed by the ISSG process, which is performed at a temperature of about 1050°

Figure 12:
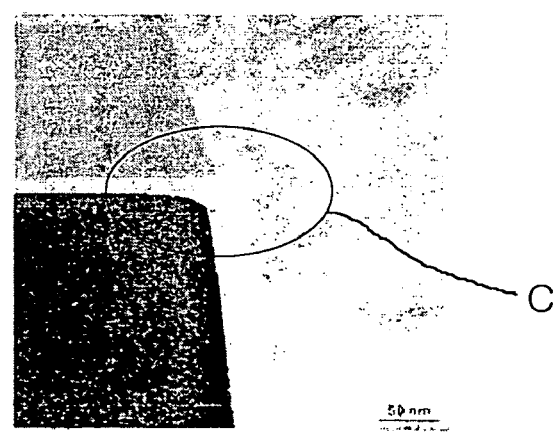
FIGS. 12 and 13 are TEM photographs showing wall oxide films formed by a furnace process.
Figure 13:
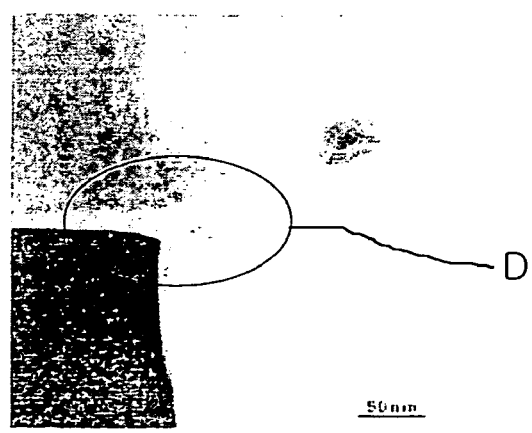

C., according to a preferred embodiment. FIG. 12 shows a wall oxide film C formed by a dry furnace process, which is performed at a temperature of about 1100° C. in a gas atmosphere of $O_2$ using a furnace apparatus. FIG. 13 shows a wall oxide film D formed by a wet furnace process, which is performed at a temperature of about 950° C. using a furnace.

From FIGS. 11 to 13, it can be seen that the wall oxide film B formed by the ISSG oxidization process according to a preferred embodiment has a good profile characteristic at the top edge of the trench compared to the wall oxide films C and D formed using the furnace apparatus. Of course, the ISSG oxidization process according to a preferred embodiment can be performed at a lower temperature than that performed in the furnace. It is thus possible to reduce thermal stress.

Meanwhile, the ISSG process for forming the wall oxide films 18 can be performed after the spacers 16a are removed using a cleaning process using DHF (or BOE) and SC-1, if necessary.

Figure 10:
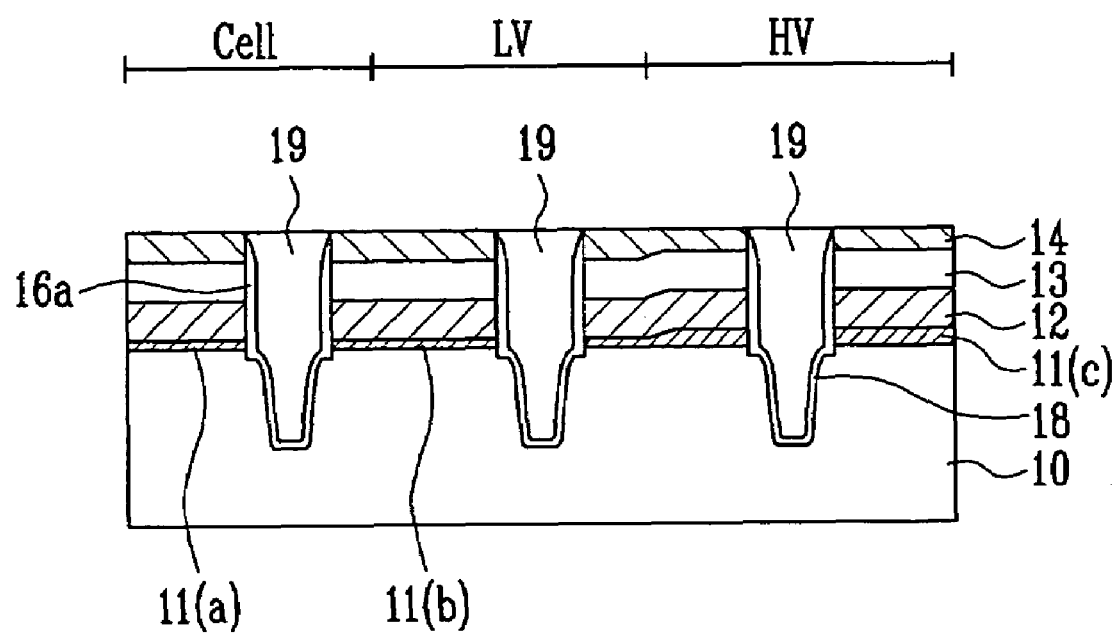

Referring to FIG. 10, an insulating film 19 for an isolation film is formed on the entire surface including the wall oxide films 18. At this time, the insulating film 19 is formed using a high density plasma (HDP) oxide film. At this time, the insulating film 19 is preferably gap-filled so that voids are not generated in the first and second trenches 15 and 17. Furthermore, the insulating film 19 can be deposited with a thickness of about 4000 Å to 1000 Å.

A polishing process is then performed to polish the entire top surface of the insulating film 19. At this time, the polishing process is a CMP process, but it can be performed so that the hard mask is recessed to a given thickness or the hard mask is completely removed to a point where some of the pad nitride film 12 is recessed.

A cleaning process is applied to the polished entire surface. In this time, the cleaning process can be performed using DHF and SC-1 so as to compensate portions damaged in the polishing process or remove unnecessary materials, etc. which exist on the entire surface.

Thereafter, although not shown in the drawings, an etch process using phosphoric acid ($H_3PO_4$) is performed to completely remove the hard mask and/or the pad nitride film 12 which remain after the polishing process. At this time, the etch process is preferably performed using the oxide film 11 as an etch stopper so that the semiconductor substrate 10 is not damaged.

Next, in order to control the effective field thickness (EFT) of the insulating film 19 to a thickness of about 50 Å to 150 Å, a cleaning process using DHF and SC-1 can be effected. Thereby, the isolation films are formed in the cell region Cell, the low voltage region LV and the high voltage region HV.

As described above, after trenches are formed, an ISSG oxidization process is performed to form wall oxide films on sidewalls of the trenches. It prohibits facets from being formed at top and bottom edge portions of the trenches. Thus, the top edges of the trenches are rounded. Furthermore, the ISSG oxidization process is performed at low temperature for a relatively short time. Therefore, stress due to an oxidization process for a long time is reduced and a dislocation phenomenon is thus prevented from occurring.

Although the foregoing description has been made with reference to the preferred embodiments, it is to be understood that changes and modifications of the disclosed methods may be made by the ordinary skilled in the art without departing from the spirit and scope of the appended claims.

What is claimed is:

1. A method for forming an isolation film in a flash memory device, comprising:
   providing a semiconductor substrate in which a pad oxide film is formed;
   depositing a pad nitride film on the pad oxide film;
   etching the pad nitride film and the pad oxide film, and contemporaneously recessing some of a top of the semiconductor substrate to form first trenches;
   forming spacers on the sidewalls of the first trenches;
   performing a first oxidization process in a ISSG oxidization mode in a gas atmosphere comprising $H_2$ and $O_2$, thereby oxidizing the top of the semiconductor substrate which is exposed between the spacers;
   etching the semiconductor substrate through the first trenches to form second trenches;
   performing a second oxidization process in a ISSG oxidization mode in a gas atmosphere comprising $H_2$ and $O_2$, thus forming wall oxide films on sidewalls of the second trenches; and
   forming an isolation film to fill the second trenches.

2. The method according to claim 1, wherein the first and second oxidization processes are performed at a temperature ranging from 850 to 1000° C.

3. The method according to claim 2, wherein the first and second oxidization processes are performed at a pressure ranging from 1 to 10 torr.

4. The method according to claim 1, wherein the gas atmosphere comprising $H_2$ and $O_2$ has more $O_2$ than $H_2$.

5. The method according to claim 4, wherein in the gas atmosphere comprising $H_2$ and $O_2$ has a mixing ratio of $O_2$ of 33% to 60%.

6. The method according to claim 4, wherein in the gas atmosphere comprising $H_2$ and $O_2$ has a mixing ratio of $H_2$ of 0.5% to 33%.

7. The method according to claim 1, wherein the wall oxide films are formed with a thickness ranging from 15 to 30 Å.

* * * * *